(12) United States Patent
Apfelbacher et al.

(10) Patent No.: US 7,405,943 B2
(45) Date of Patent: Jul. 29, 2008

(54) ELECTRONIC APPLIANCE COMPRISING A FLOATING CIRCUIT CARRIER

(75) Inventors: Walter Apfelbacher, Freihung (DE); Annemarie Lehmeier, Ursensollen (DE); Johann Seitz, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 478 days.

(21) Appl. No.: 10/529,644

(22) PCT Filed: Sep. 18, 2003

(86) PCT No.: PCT/DE03/03105

§ 371 (c)(1),
(2), (4) Date: Oct. 3, 2005

(87) PCT Pub. No.: WO2004/032589

PCT Pub. Date: Apr. 15, 2004

(65) Prior Publication Data

US 2006/0120057 A1     Jun. 8, 2006

(30) Foreign Application Priority Data

Oct. 2, 2002    (DE) .................................. 102 46 095

(51) Int. Cl.
*H05K 7/14* (2006.01)
(52) U.S. Cl. ........................ 361/752; 361/730; 361/728; 174/520
(58) Field of Classification Search ................ 361/752, 361/728, 729, 730, 753, 756; 174/520, 50
See application file for complete search history.

(56) References Cited

U.S. PATENT DOCUMENTS

| | | | |
|---|---|---|---|
| 4,037,270 A * | 7/1977 | Ahmann et al. | 361/689 |
| 4,811,168 A | 3/1989 | Chesnut et al. | |
| 5,109,317 A * | 4/1992 | Miyamoto et al. | 361/715 |
| 5,258,889 A | 11/1993 | Belanger | |
| 5,412,166 A * | 5/1995 | Krupp et al. | 200/6 R |
| 5,751,251 A * | 5/1998 | Hutchinson | 343/715 |
| 5,793,106 A * | 8/1998 | Yasukawa et al. | 257/712 |

FOREIGN PATENT DOCUMENTS

| | | |
|---|---|---|
| DE | 42 43 656 A1 | 5/1994 |
| DE | 196 30 173 A1 | 1/1998 |
| DE | 297 19 962 U1 | 2/1998 |
| DE | 1 014 771 A | 6/2000 |
| DE | 199 55 100 A1 | 11/2000 |
| DE | 101 03 950 C1 | 8/2002 |
| WO | WO 01/087029 A | 11/2001 |

OTHER PUBLICATIONS

Deutsches Patent- und Markenamt Apr. 1, 2003.
International Search Report (PCT/ISA/210) Feb. 12, 2004.
Int'l Preliminary Examination Report (IPEA/409 &PCT/IPEA/416) Apr. 5, 2004.

* cited by examiner

*Primary Examiner*—Jeremy C. Norris
*Assistant Examiner*—Dameon E. Levi
(74) *Attorney, Agent, or Firm*—Harness, Dickey & Pierce, PLC

(57) ABSTRACT

An electronic appliance is especially easy to assemble and includes a housing and a circuit carrier which is held in the housing. The circuit carrier is guided in the housing in a displaceable manner and is applied by at least one spring element against a housing abutment which accurately centres the circuit carrier.

13 Claims, 2 Drawing Sheets

ELECTRONIC APPLIANCE COMPRISING A FLOATING CIRCUIT CARRIER

This application is the national phase under 35 U.S.C. §371 of PCT International Application No. PCT/DE2003/003105 which has an International filing date of Sep. 18, 2003, which designated the United States of America and which claims priority on German Patent Application number DE 102 46 095.7 filed Oct. 2, 2002, the entire contents of which are hereby incorporated herein by reference.

FIELD OF THE INVENTION

The invention generally relates to an electronic appliance. In particular, it relates to a switchgear appliance, having a housing and an electronic circuit carrier held therein.

BACKGROUND OF THE INVENTION

The circuit carrier provided in an appliance is usually designed in the form of a so-called printed circuit board assembly. This is understood to be a printed circuit board populated with elements of an electronic circuit. The elements may include, in particular, indication elements (e.g. light emitting diodes, etc.), setting elements (e.g. potentiometers and switches, etc.) and also connecting elements (e.g. male strip connectors or terminals, etc.). Moreover, the printed circuit board assembly is often electrically conductively connected to separate elements arranged in the housing, such as e.g. connecting terminals and further electronic components, etc.

A simple, in particular easily automatable mounting of the circuit carrier in the housing is desirable in order to lower production costs. On the other hand, the circuit carrier must be positioned exactly and as far as possible without any play in the housing in order to allow for the setting and connecting elements to be readily accessible from the housing exterior, or to allow for the indication elements to be readily visible through corresponding housing openings or housing windows.

In conventional appliances of this type, the circuit carrier is often pushed into a rigid housing guide in which it is fixed after assembly of the housing. With a rigid guide, however, a play-free mounting of the circuit carrier is technically impossible to realize or realizable only with difficulty.

DE 42 43 656 A1 discloses a carrier material fastening device in which the carrier material can be brought to its final mounted position by pressing away a holder with compliant parts laterally with respect to the mounting device and can be fixed in the position by snapping back the holder between it and a chassis supporting claw. The carrier material can be separated again from the chassis by exerting a lateral pressure on the holder.

DE 196 30 173 A1 discloses a power module having a module lamina which, in order for it to be fixed mechanically, is pressed against an insulating ceramic area by a housing. Further, in order for it to make electrical contact with printed circuit boards, it is acted on by separate rotary contact springs mounted in the housing.

SUMMARY OF THE INVENTION

An embodiment of the invention is based on an object of specifying an electronic appliance which can be assembled in a simple manner and/or in which the circuit carrier is positioned particularly precisely in the housing.

Accordingly, the circuit carrier of an electronic appliance of at least one embodiment, even with the housing closed, may be guided in a displaceable manner therein and may be acted on against a housing stop by at least one spring element, which simultaneously serves as an electrical contact element. The circuit carrier may thus be mounted in a floating manner in the housing and the spring contact according to at least one embodiment of the invention not only may serve for the floating mounting of the circuit carrier, but at the same time also may establish the electrical connection between the circuit carrier and a separate element, e.g. a contact terminal, etc. Complicated soldering of the circuit carrier during assembly is thus superfluous. The or each spring contact is preferably formed as a resilient pin contact.

The floating mounting of the circuit carrier enables a particularly simple assembly of the appliance, especially as the circuit carrier can initially be inserted into the housing guide without any pressure. The circuit carrier may be positioned and fixed automatically during assembly of the housing by the spring element that is prestressed in this case. When the housing is closed, the spring element can act on the circuit carrier in such a way that the latter is pressed against a housing stop that centers the circuit carrier in the desired position. In this way, the circuit carrier may be mounted essentially without any play and in a positionally accurate manner between the housing stop and the spring element.

The circuit carrier, in at least one embodiment, is preferably a printed circuit board assembly, i.e. in particular formed in a boardlike manner. In this case, the circuit carrier is expediently guided in a displaceable manner perpendicularly to the board plane in the housing, thereby enabling the circuit carrier to be inserted into the housing guide in a particularly simple manner.

In an advantageous refinement of an embodiment of the invention, the insertion of the circuit carrier is furthermore facilitated by the fact that the circuit carrier is provided with a guide contour in the form of two indentations arranged at opposite side edges which indentations interact with corresponding housing projections that protrude into the housing interior. The housing projections are preferably realized by screw channels provided in the housing. The screw channels penetrate through the housing and serve for receiving a respective fastening screw by which the appliance can be screwed onto a carrier.

BRIEF DESCRIPTION OF THE DRAWINGS

An exemplary embodiment of the invention is explained in more detail below with reference to drawings, in which.

Mutually corresponding parts are provided with the same reference symbols in the figures.

DETAILED DESCRIPTION OF THE EXAMPLE EMBODIMENTS

Figure 1:
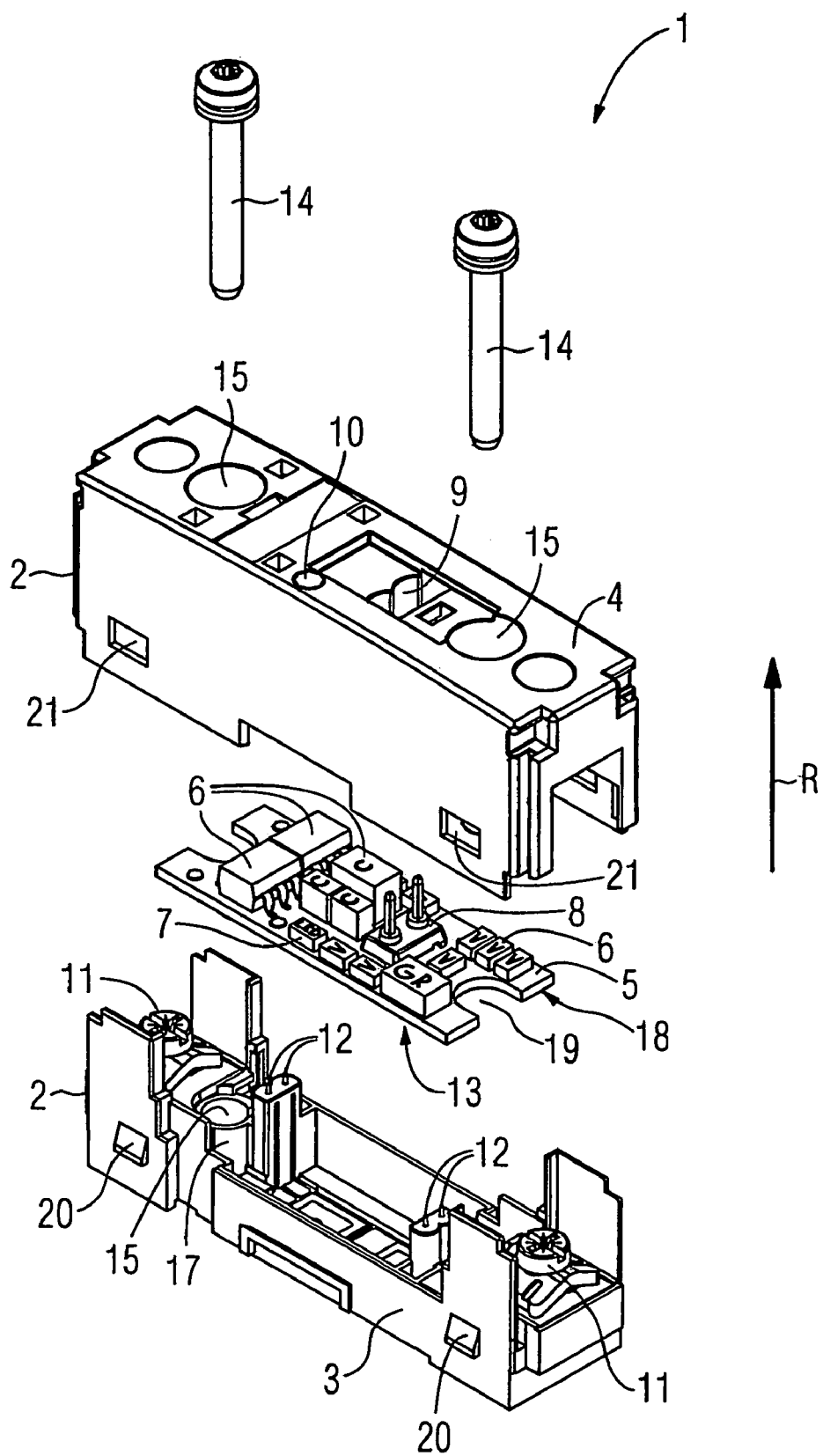
FIG. 1 shows, in an exploded illustration obliquely from above, an electronic appliance with a circuit carrier embodied as a printed circuit board assembly.

The electronic appliance 1 shown in the exploded illustration in FIG. 1 is a switchgear appliance, by way of example. The appliance 1 includes an insulating housing 2 having a troughlike housing bottom 3 and a housing cover 4 that can be emplaced thereon. The appliance 1 furthermore includes a printed circuit board assembly 5, e.g. a boardlike circuit carrier populated with elements of an electronic circuit, in particular electronic components 6. The printed circuit board assembly 5 can be inserted into the housing 2. The components 6 include in particular a light emitting diode (LED) 7.

The printed circuit board assembly 5 is furthermore provided with a male strip connector 8. In this case, the male strip connector 8 corresponds with a socketlike housing opening 9 in the housing cover 4, through which the male strip connector 8 can be contact-connected from the housing exterior. The light-emitting diode 7 in turn corresponds with a housing window 10 arranged in the housing cover 4. For entirely satisfactory functioning of the appliance 1, it is necessary for the printed circuit board assembly 5 to be positioned precisely with regard to the housing cover 4, in order to ensure that, on the one hand, the light-emitting diode 7 is arranged in the region of the housing window 10 and, on the other hand, the male strip connector 8 is centered with regard to the housing opening 9.

The printed circuit board assembly 5 is furthermore connected to two contact terminals 11, which are arranged in the housing bottom 3, and further electronic components (not specifically illustrated). The contact between these separate elements and the printed circuit board assembly 5 may be established via pin contacts 12 which protrude into the housing interior from the housing bottom 3 and make contact with the printed circuit board assembly 5 at the underside 13 thereof.

The appliance 1 is furthermore provided with two fastening screws 14 which serve for fastening the appliance 1 to a carrier (not illustrated), for example within a switchgear cabinet. For this purpose, each fastening screw 14 can be inserted into a screw channel 15 that penetrates through both the housing cover 4 and the housing bottom 3.

Figure 2:
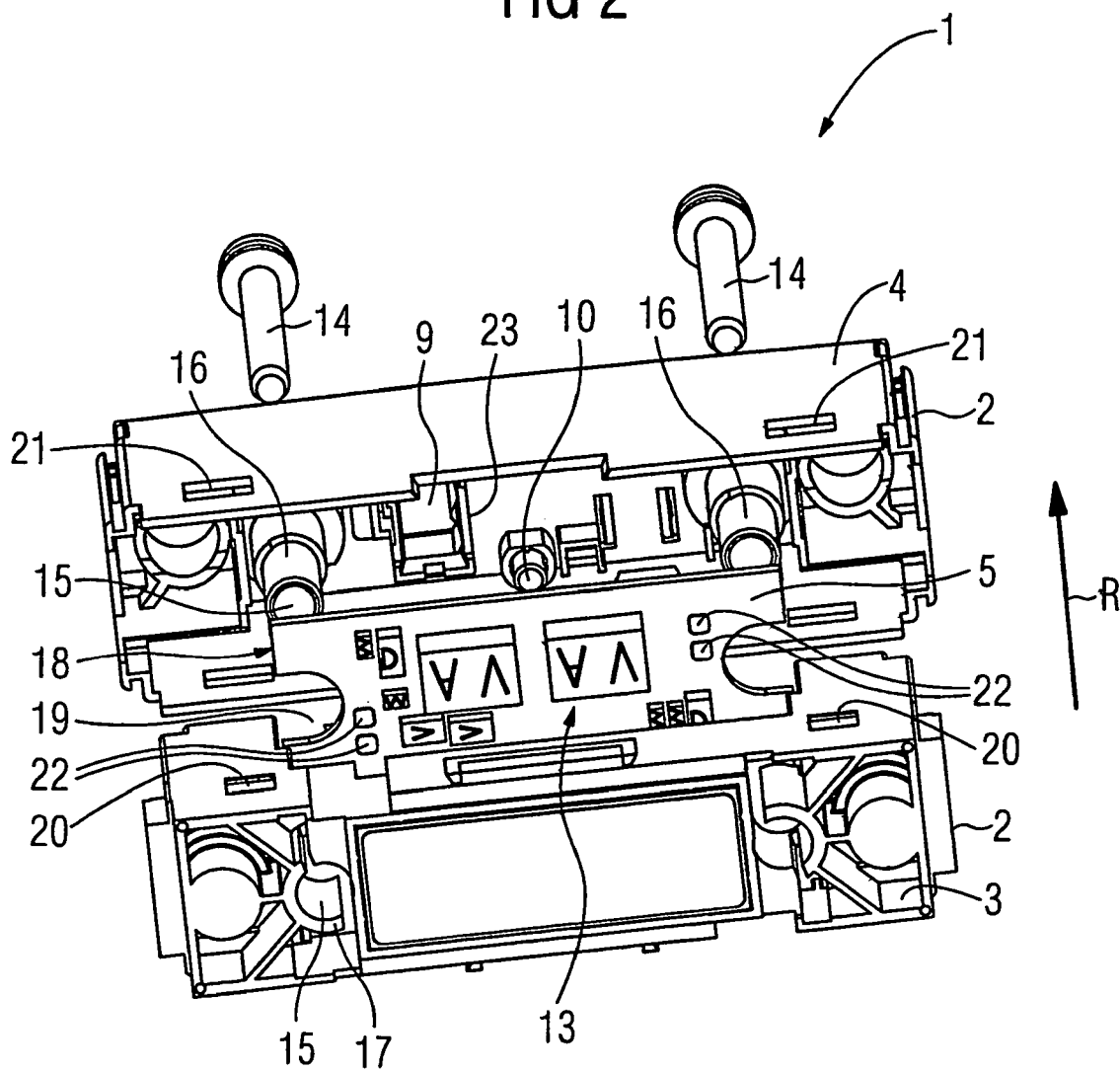
FIG. 2 shows the electronic appliance in accordance with FIG. 1 in an exploded illustration obliquely from below.

As can be seen in particular from a joint consideration of FIGS. 1 and 2, each screw channel 15 is formed by an approximately hollow-cylindrical housing projection 16 which protrudes into the housing interior from the housing cover 4 and abuts on a corresponding hole 17 in the housing bottom 3 when the housing 2 is joined together.

During assembly of the appliance 1, firstly the printed circuit board assembly 5 is inserted into the housing cover 4 in such a way that it is accommodated between the two housing projections 16. For this purpose, each longitudinal end 18 of the printed circuit board assembly 5 is provided with an indentation 19 which serves as a guide contour and introduction aid and each of which receives a corresponding projection 16 in a positively locking manner with play. In other words, with the printed circuit board assembly 5 inserted, the edge of the indentation 19 engages loosely around the circumference of the projection 16 from three sides.

The printed circuit board assembly accommodated between the two projections 16 is thus pre-fixed with regard to a direction parallel to its board plane. However, the printed circuit board assembly 5 can be displaced perpendicularly to its board plane with respect to the housing cover 4.

In a subsequent assembly step, the housing bottom 3 is pushed into the housing cover 4 in assembly direction R until latching lugs 20 fitted to the housing bottom 3 latch in corresponding receptacles 21 in the housing cover 4 and the housing bottom 3 is thereby fixed captively to the housing cover 4. During this assembly step, each pin contact 12 is pressed against a corresponding contact area 22 arranged on the underside 13 of the printed circuit board assembly 5. On account of their resilient action, the contact pins 12 in this case yield somewhat counter to the assembly direction R and are prestressed in this case against the printed circuit board assembly 5. When the housing 2 is closed, on the one hand the electrical contact between the contact terminals 11 and the printed circuit board assembly 5 is thus established via the contact pins 12 and the contact areas 22.

Moreover, when the housing 2 is closed, the printed circuit board assembly 5 is on the other hand mounted in a displaceable manner and thus in a floating manner against the prestress of the contact pins 12.

The printed circuit board assembly 5 is acted on against the housing cover 4 by the prestress of the contact pins 12, the male strip connector 8 being pressed against the inner edge 23 of the housing opening 9. As a result of the male strip connector 8 resting on the contour of the inner edge 23, which serves as a housing stop, the printed circuit board assembly 5 is automatically fixed with pinpoint accuracy and to a good approximation without any play during the assembly of the housing 2.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. An electronic appliance, comprising:
    housing;
    a circuit carrier guidable into the housing in a displaceable manner by a spring contact adapted to act against a housing stop, wherein the spring contact is adapted to interact and make electrical contact with a respective contact area of the circuit, the circuit carrier being board-like and being guidable in a displaceable manner perpendicularly with regard to the board plane thereof, the circuit carrier having a respective indentation at two opposite side edges, and a corresponding housing projection protruding into the housing being accommodated in said indentation in a positively locking manner.

2. The electronic appliance as claimed in claim 1, wherein the spring contact is a resilient pin contact.

3. The electronic appliance as claimed in claim 1 wherein at least one housing projection is present, and wherein the at least one housing projection is a screw channel provided for receiving a fastening screw.

4. The electronic appliance as claimed in 1, wherein the housing, adapted to acted on with the circuit carrier against the housing stop by the spring element, is further adapted to be closed by a housing cover that is adapted to be emplaced on the axis along which the spring element acts.

5. The electronic appliance as claimed in claim 4, wherein a male strip connector, provided with the circuit carrier and adapted to be contact-connected outside the housing, is fixable in a corresponding socketlike housing opening in the emplaced housing cover by the pressure of the spring element onto the circuit carrier.

6. The electronic appliance as claimed in claim 1, wherein the electronic appliance is a switchgear appliance.

7. The electronic appliance as claimed in claim 2, wherein at least one housing projection is present, and wherein the at least one housing projection is a screw channel provided for receiving a fastening screw.

8. The electronic appliance as claimed in claim 2, wherein the housing, adapted to be acted on with the circuit carrier against the housing stop by the spring element, is further adapted to be closed by a housing cover that is adapted to be emplaced on the axis along which the spring element acts.

9. The electronic appliance as claimed in claim 3, wherein the housing, adapted to be acted on with the circuit carrier against the housing stop by the spring element, is further adapted to be closed by a housing cover that is adapted to be emplaced on the axis along which the spring element acts.

10. The electronic appliance as claimed in claim 7, wherein the housing, adapted to be acted on with the circuit carrier against the housing stop by the spring element, is further adapted to be closed by a housing cover that is adapted to be emplaced on the axis along which the spring element acts.

11. The electronic appliance as claimed in claim 8, wherein a male strip connector, provided with the circuit carrier and adapted to be contact-connected outside the housing, is fixable in a corresponding socketlike housing opening in the emplaced housing cover by the pressure of the spring element onto the circuit carrier.

12. The electronic appliance as claimed in claim 9, wherein a male strip connector, provided with the circuit carrier and adapted to be contact-connected outside the housing, is fixable in a corresponding socketlike housing opening in the emplaced housing cover by the pressure of the spring element onto the circuit carrier.

13. The electronic appliance as claimed in claim 10, wherein a male strip connector, provided with the circuit carrier and adapted to be contact-connected outside the housing, is fixable in a corresponding socketlike housing opening in the emplaced housing cover by the pressure of the spring element onto the circuit carrier.

* * * * *